United States Patent
Ice et al.

(10) Patent No.: US 6,893,293 B2
(45) Date of Patent: May 17, 2005

(54) ANGLED EMI SHIELD FOR TRANSCEIVER-PCB INTERFACE

(75) Inventors: Donald A. Ice, Milpitas, CA (US); Lewis B. Aronson, Los Altos, CA (US)

(73) Assignee: Finisar Corporation, Sunnyvale, CA (US)

(*) Notice: Subject to any disclaimer, the term of this patent is extended or adjusted under 35 U.S.C. 154(b) by 0 days.

(21) Appl. No.: 10/633,094

(22) Filed: Aug. 1, 2003

(65) Prior Publication Data

US 2004/0203289 A1 Oct. 14, 2004

Related U.S. Application Data

(60) Provisional application No. 60/400,848, filed on Aug. 2, 2002.

(51) Int. Cl.[7] .............................................. H01R 13/648
(52) U.S. Cl. ...................................................... 439/607
(58) Field of Search .......................................... 439/607

(56) References Cited

U.S. PATENT DOCUMENTS 6,315,608 B1 * 11/2001 Lopata et al. ............... 439/607
6,634,803 B2    10/2003 Brezina et al.
6,655,955 B2    12/2003 Wachter et al.
6,752,663 B2 *  6/2004 Bright et al. ............... 439/607
2003/0171033 A1 * 9/2003 Bright et al. ............... 439/607

OTHER PUBLICATIONS

XFP Specification, Revision 3.1, *Chapter 6: Mechanical and Board Definition*, pp. 97–120, Apr. 2, 2003.

* cited by examiner

*Primary Examiner*—J. F. Duverne
*Assistant Examiner*—Phuong Dinh
(74) *Attorney, Agent, or Firm*—Workman Nydegger

(57) ABSTRACT

A shield element for reducing electromagnetic interference ("EMI") in an optical transceiver module assembly. The transceiver module assembly includes an optical transceiver received within a cage. The cage mounts to a host board and receives in one end thereof a right angle connector of the host board. A rear end of the optical transceiver includes an edge connector that electrically interfaces with a receptacle of the right angle connector. An EMI shield element is interposed between the rear end of the optical transceiver and the right angle connector. The EMI shield element includes a base that surrounds a portion of the right angle connector. Wall portions upwardly extend from the base around the right angle connector to form an angled shield seating surface that engages with a complementarily angled seating surface on the transceiver rear end, thereby forming an EMI shield when the optical transceiver is received into the cage.

21 Claims, 20 Drawing Sheets

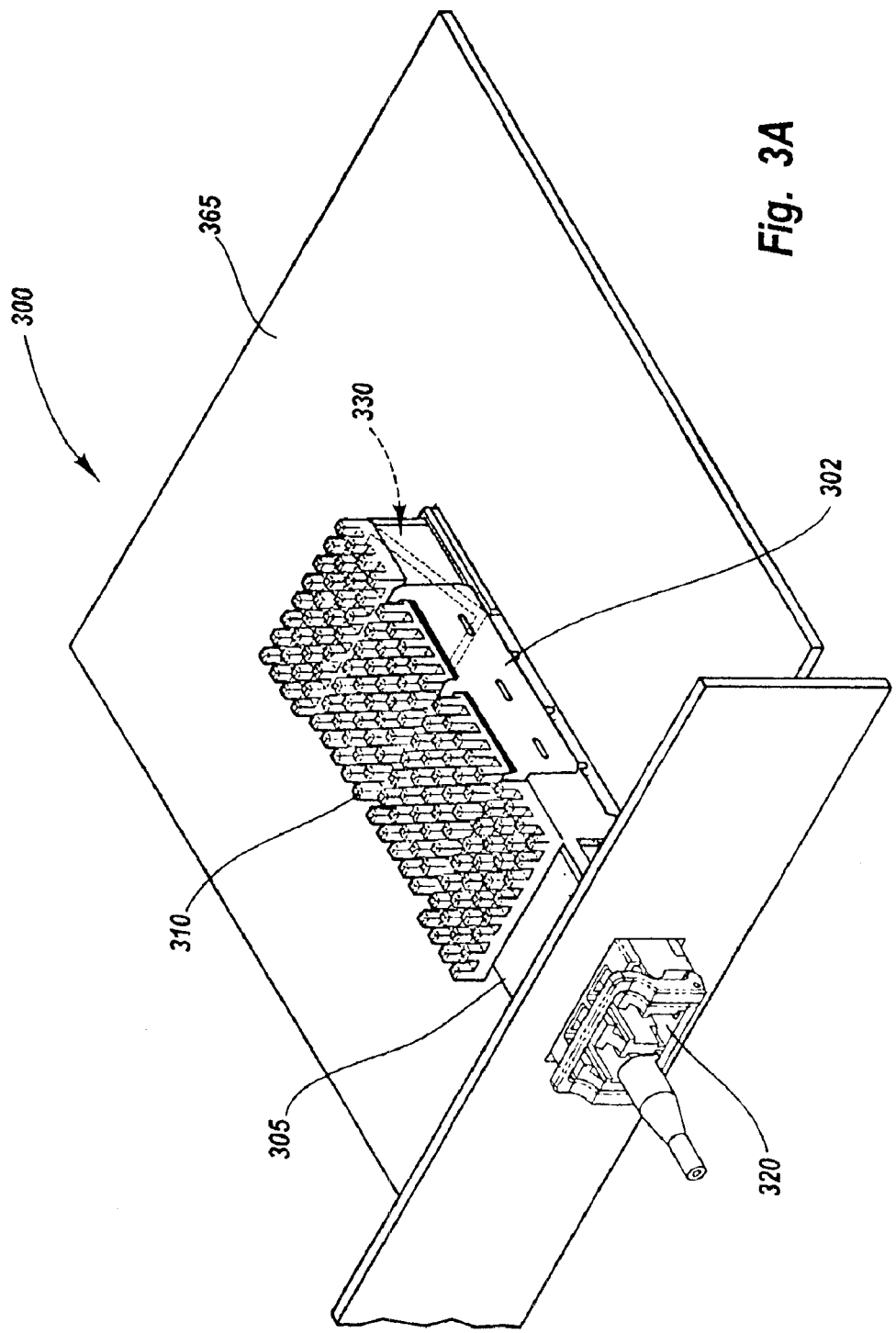

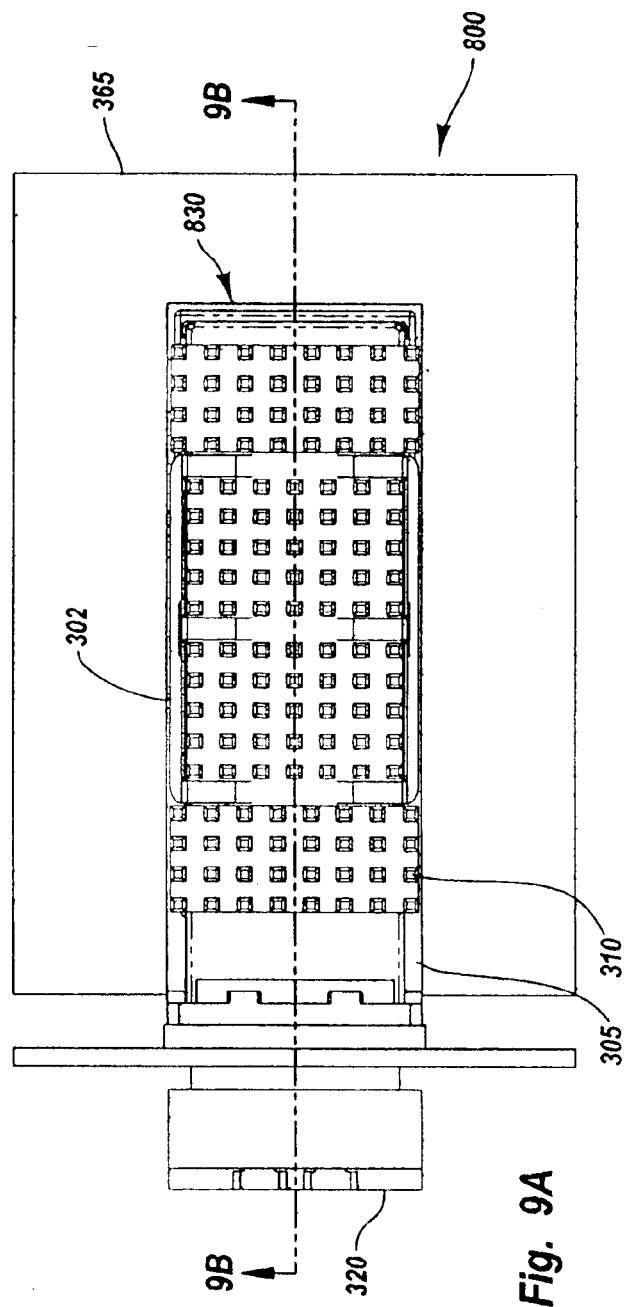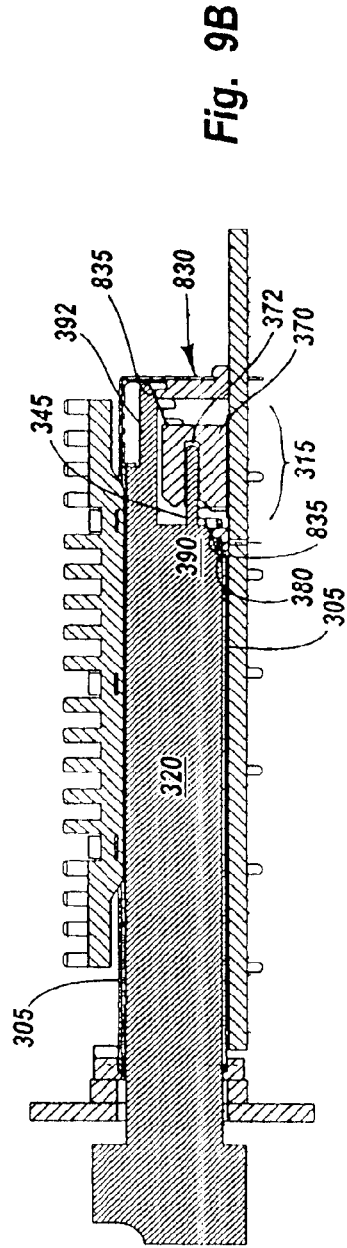

ANGLED EMI SHIELD FOR TRANSCEIVER-PCB INTERFACE

CROSS-REFERENCE TO RELATED APPLICATIONS

This application claims the benefit of U.S. Provisional Application No. 60/400,848, filed Aug. 2, 2002, which is incorporated herein by reference in its entirety.

BACKGROUND OF THE INVENTION

1. The Field of the Invention

The present invention relates generally to electromagnetic interference (EMI) shields for transmitter, receiver, transponder, or transceiver modules.

2. The Related Technology

Pluggable transceiver modules are of interest in a variety of communication systems. A z-axis pluggable transceiver module is designed to be slid into a receptacle. Appropriate power supply and signal connections are engaged when the module is locked into its fully inserted position.

One problem associated with pluggable transceiver modules is achieving a high attenuation factor for electromagnetic interference (EMI) generated by the electronics in the module. This is of particular concern for high data rate transceivers. As is known in the art of high frequency electronics, an increase in the data rate of high-speed electronics tends to increase the emission of high-frequency EMI radiation. Moreover, high frequency EMI emissions can penetrate even comparatively small gaps in EMI shielding. Consequently, greater care must be taken in high data rate transceivers to achieve adequate EMI shielding.

Some of the problems associated with shielding high data rate transceiver modules can be illustrated with reference to FIG. 1. FIG. 1 is an exploded perspective drawing of z-axis hot pluggable module that has been proposed by the 10-Gigabit Small Form-factor Pluggable (XFP) Module Group, a module Multi Source Agreement (XFP-MSA) association. The XFP-MSA is an association of companies developing a specification for a 10 Gb/s transceiver module having compatible mechanical and electrical features.

Referring again to FIG. 1, a transceiver module 10 is designed to slide into a cage assembly 12. A host board 14 includes a so-called "right angle" surface-mount connector 16 that fits through a bottom rear end opening of the cage. The rear end of the transceiver module includes a printed circuit board having an edge connector. The edge connector is inserted into a receptacle of right angle surface mount connector 16. The host signal interface includes the right angle surface mount connector 16 and associated high-speed interconnects. For XFP modules there is an associated 10 Gb/s serial interface (XFI), which is the high speed serial electrical interface for connecting a high data rate signal source (e.g., to a serializer/deserializer) to the transceiver module, with the XFI channel including the right angle connector 16, host board 14, traces, and any associated vias (not shown). A heat sink 20 is mounted to the cage 12 with a clip 22 to facilitate removing heat from the module.

A problem associated with the z-axis pluggable module is that sufficient clearance must be maintained to allow insertion and extraction of the module. This makes it difficult to achieve a high degree of EMI shielding, particularly in the rear of the module about the connector. Referring to the side view of FIG. 2, one approach that has been proposed is to include an EMI gasket 24 mounted on the rear of the cage 12, so that there is additional EMI shielding disposed behind the right angle electrical connector 16 during normal use. However, this arrangement does not provide a complete EMI seal around the rear of the module 10, especially in the region of cage opening 26 through which the right angle connector 16 extends. Consequently, EMI may leak out from the rear of the cage about the connector 16.

Therefore what is desired is improved shielding of EMI emitted from the rear-end of pluggable transceiver modules.

BRIEF SUMMARY OF THE INVENTION

The present invention has been developed in response to the above and other needs in the art. Briefly summarized, embodiments of the present invention are directed to apparatus and methods for reducing the emission of electromagnetic interference ("EMI") from an optical transceiver module assembly. Such reduction desirably prevents the incursion of EMI into both a host device housing the transceiver module and the surrounding environment.

In presently preferred embodiments, an EMI shield is disclosed for use with an optical transceiver module assembly including a host board, a "right angle" connector, a cage, and a pluggable optical transceiver module ("transceiver"). The right angle connector is attached to a portion of the host board, and includes a receptacle. The right angle connector extends through an opening defined in the bottom of the cage when the cage is attached to the host board. The cage is sized and configured to receive the transceiver such that an edge connector extending from a rear end of the transceiver is received into and electrically engages with the receptacle of the right angle connector when the transceiver is fully inserted into the cage.

The EMI shield of the present invention is configured to prevent EMI emissions from the region surrounding the interface between the right angle connector and the transceiver edge connector. The EMI shield in one embodiment includes a horizontal, substantially square base and four contiguous walls, including front and rear walls, and two side walls, that each extend from the base. An aperture is formed in the EMI shield, bounded by the front, rear, and side walls. The shield is aligned with the connector hole formed in the cage such that the shield aperture receives a portion of the right angle connector therein when the cage is attached to the host board.

The contiguous walls of the EMI shield are sized and shaped to improve the shielding characteristics of the optical transceiver module assembly. Specifically, the rear wall of the EMI shield has a height greater than that of the front wall, while each side wall is angled to join respective ends of the front and side walls. This arrangement forms a continuous top surface of the shield that is angled with respect to its horizontal base. The continuous top surface serves as a seating surface for mating the EMI shield with the rear end of the transceiver, which is complementarily angled with respect to the EMI shield seating surface. So configured, the rear end of the transceiver and the mounting surface of the EMI shield engage one another when the transceiver is fully received into the cage and the edge connector mates with the receptacle of the right angle connector. In this way, the EMI shield forms a barrier to prevent the emission of EMI from the edge connector/right angle connector interface, thereby preventing EMI incursion into the host device and/or surrounding environment.

In another embodiment, the continuous top surface formed by the contiguous walls of the EMI shield includes a plurality of extended surfaces arranged in a spaced apart configuration. The top of each extended surface engages with the angled rear end of the transceiver to form an EMI barrier to prevent undesired emissions from the edge connector/right angle connector interface during transceiver operation.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 3A is a perspective view of a module inserted into a cage on a host board;

FIG. 9A is a top view of a transceiver module system configured in accordance with another embodiment of the present invention;

FIG. 9B is a cross sectional view of the transceiver module system of FIG. 8;

DETAILED DESCRIPTION OF THE PREFERRED EMBODIMENTS

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

It is noted here that words used herein including "top," "bottom," "front," "rear", and the like are merely descriptive terms used to facilitate a complete description of the present invention to be made. Thus, these terms are not meant to limit the present invention in any way, particularly with regard to any specified orientation or description of the invention or its constituent components.

The present invention generally comprises an apparatus to shield a signal interface of a z-axis plug-in module from electromagnetic interference ("EMI"). FIG. 3A is a perspective view of one embodiment of a z-axis plug-in optical transceiver module with a shielded signal interface that forms a part of an optical transceiver module assembly 300. Also shown in FIG. 3A is a portion of an EMI shield, generally designated at 330, which serves in the present invention as a means for shielding EMI about portions of the optical transceiver module, and about which further details will be given below.

Figures 1, 2:
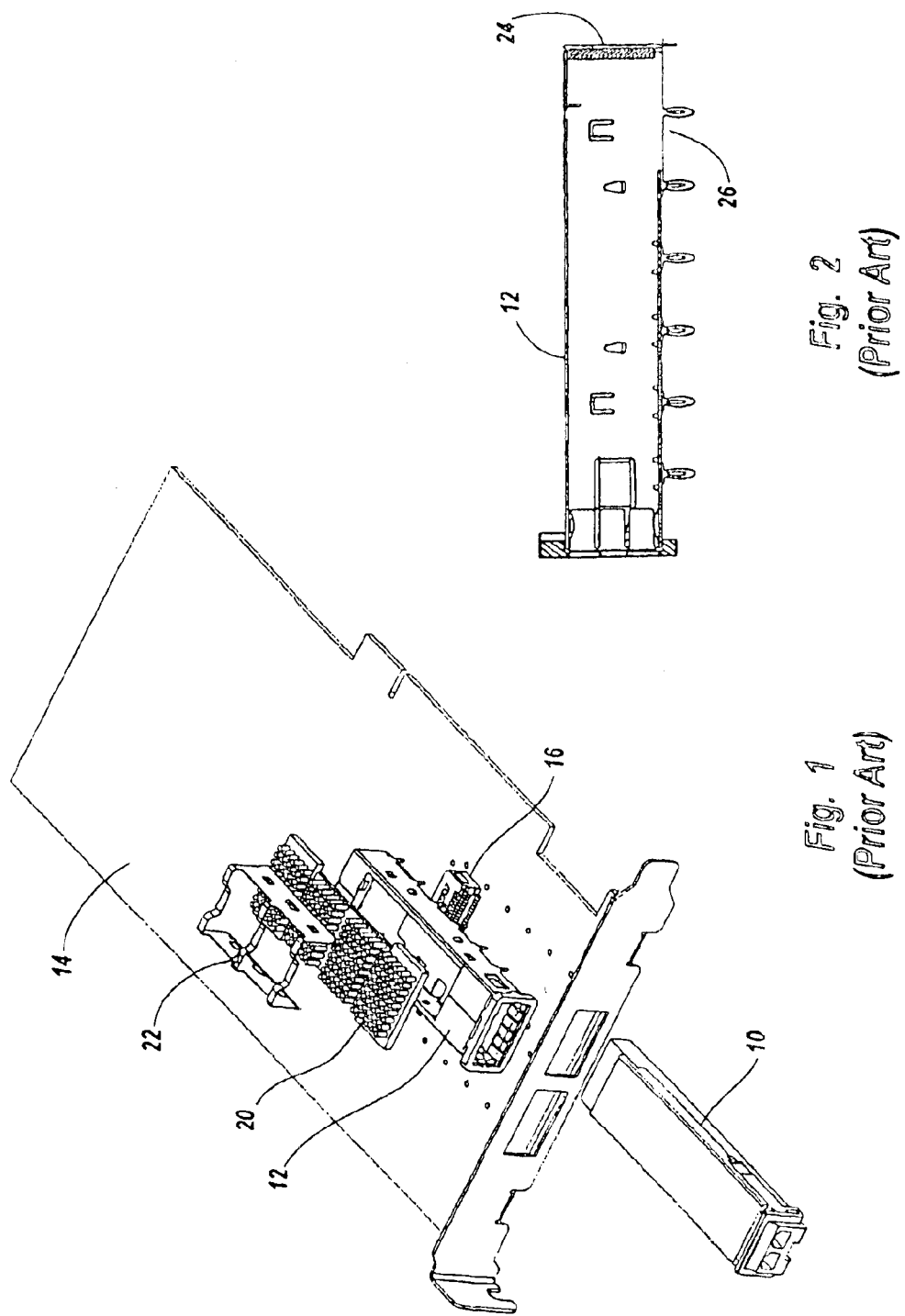
FIG. 1 is an exploded perspective view of a conventional XFP transceiver module system.
FIG. 2 is a side view illustrating the rear EMI seal of the module of FIG. 1.
Figure 3B:
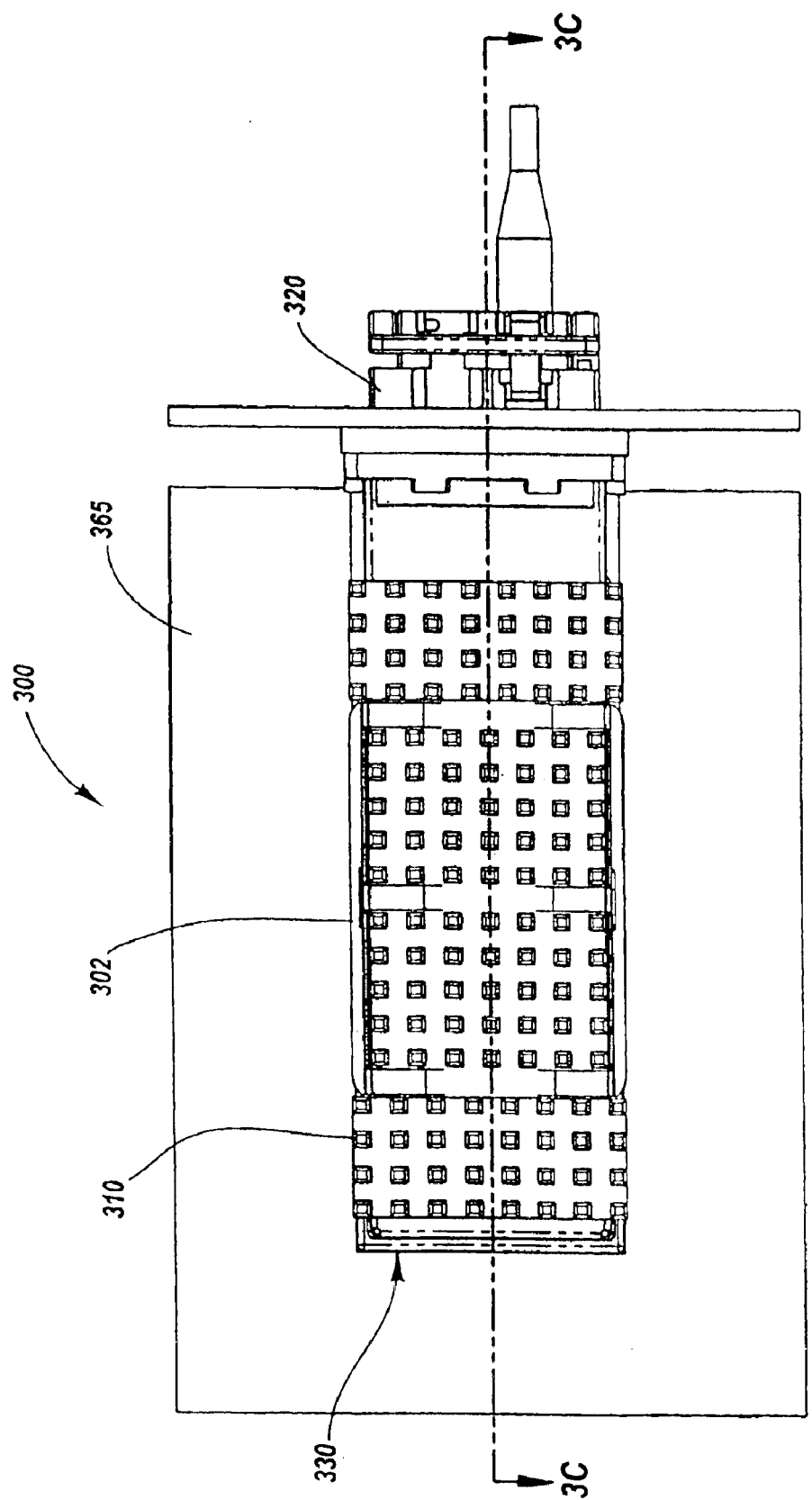
FIG. 3B is a top view of the inserted module.

During normal use, a pluggable optical transceiver module ("transceiver") 320 is inserted in a cage 305. In one embodiment, though the transceiver 320 in the present embodiment comprises an optical transceiver module, it will be understood that it can alternatively comprise a transmitter, receiver, or transponder module. Cage 305 is disposed on a host board 365. Host board 365 may, for example, comprise a printed circuit board. FIG. 3B is a top view of the assembly 300. A heat sink 310 may be attached to cage 305 via a clip 302 to remove heat from transceiver 320.

Figure 3C:
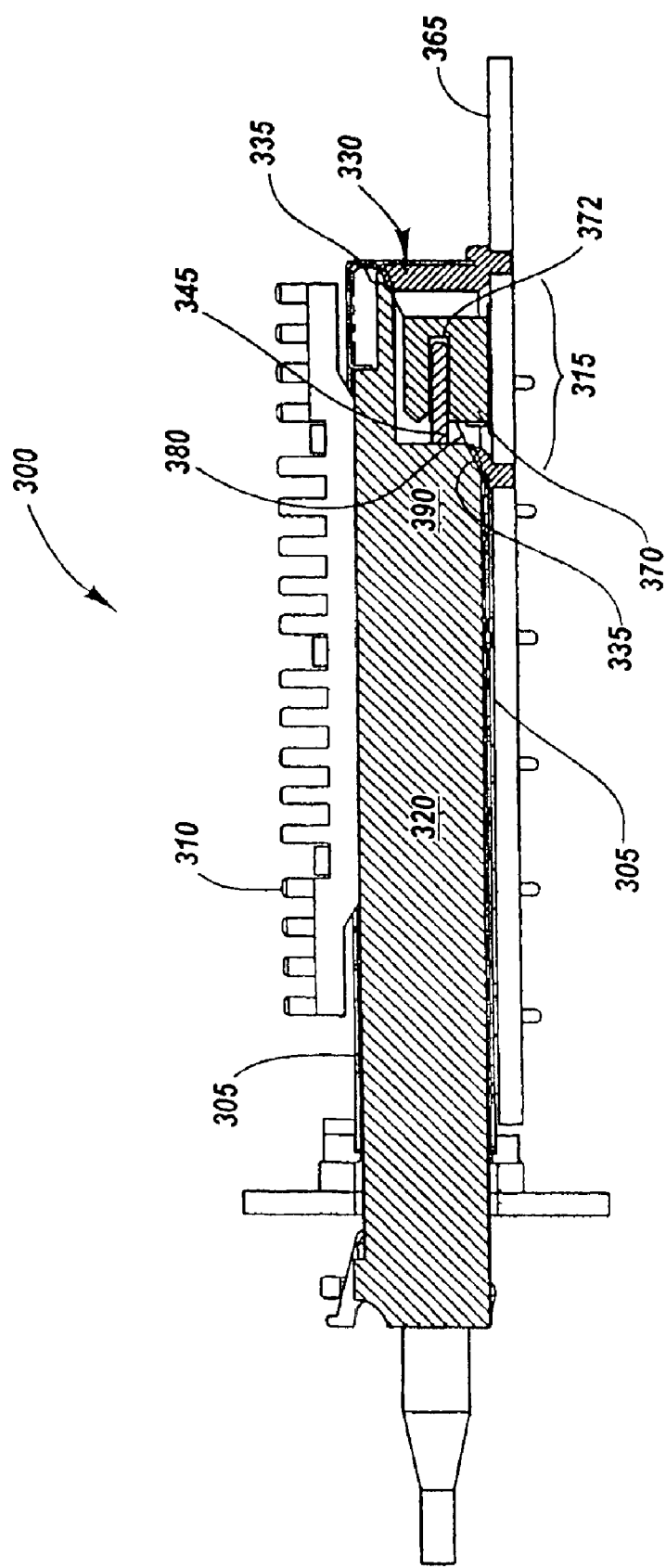
FIG. 3C is a cross section of inserted module through line 3C—3C of FIG. 3B.

FIG. 3C is a cross-sectional view of apparatus 300 along line 3C—3C of FIG. 3B. A right angle connector 370 includes a receptacle 372 for receiving an edge connector 345 of transceiver 320. Right angle connector 370 is a surface mount connector mounted to host board 365 and is part of a signal interface between a host and transceiver 320. Right angle connector 370 extends through an open portion 315 of the bottom of cage 305.

In greater detail, FIG. 3C shows the EMI shield 330 mounted to the host board 365. The EMI shield 330 is disposed about connector 370 exclusive of receptacle 372. As will be discussed in detail below, in one embodiment EMI shield 330 has a hood shape and includes front and back wall portions and two sidewall portions disposed about connector 370. The rear edges of a rear portion of transceiver 320 form a transceiver module seating surface 380. A shield seating surface 335 of the EMI shield 330 is shaped to mate with the transceiver module seating surface 380 to form a complete EMI shielding region about a rear end 390 of the transceiver 320 and right angle connector 370 when transceiver is fully inserted into cage 305.

Figure 3D:
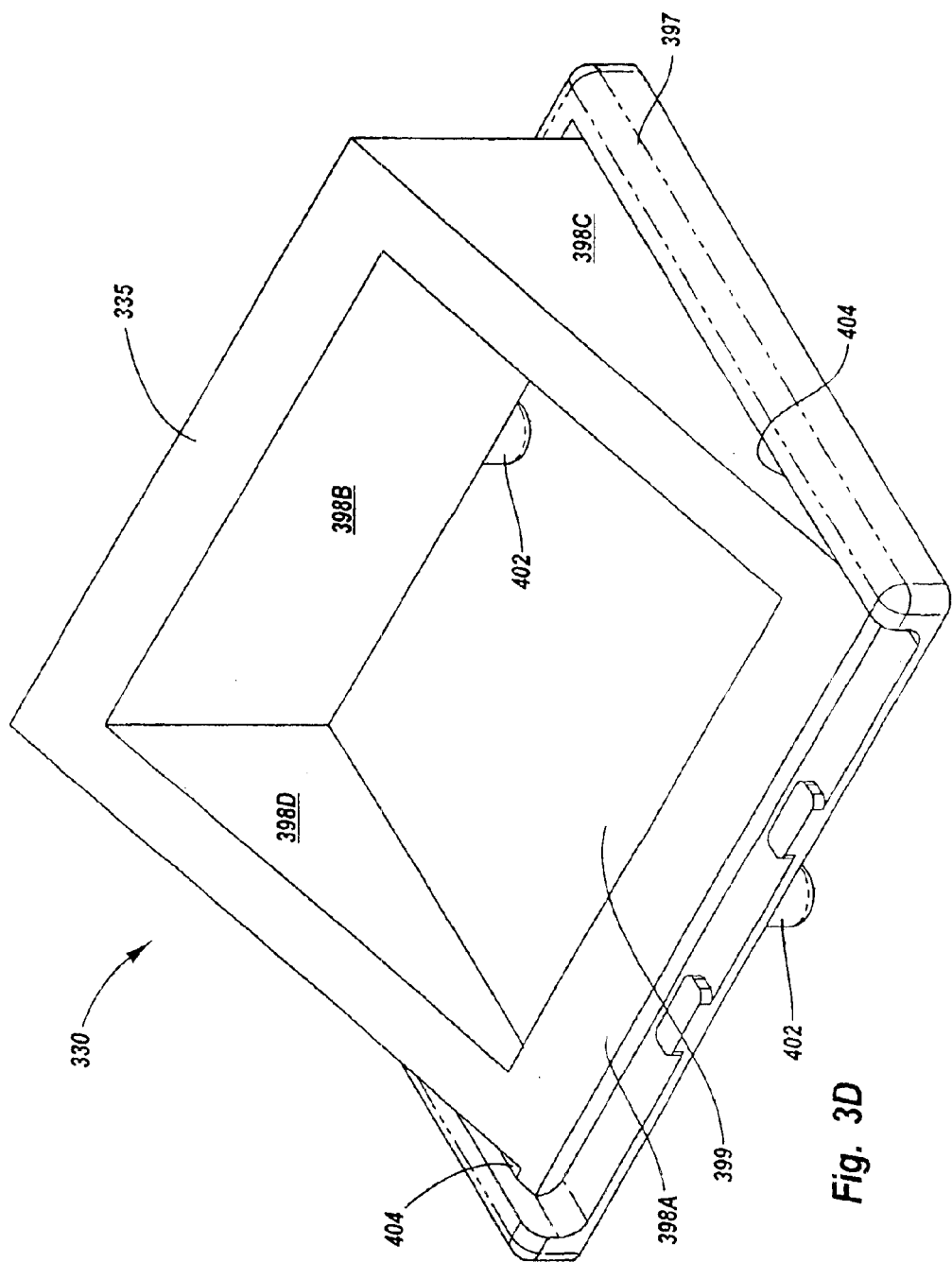
FIG. 3D is a perspective view of one embodiment of an EMI shield.

Reference is now made to FIG. 3D, which shows various details of the EMI shield 330, according to one embodiment of the present invention. As already mentioned above, the shield 330 includes the base 397 and a plurality of wall portions that form the hood shape of the shield element. Specifically, the wall portions include a front wall portion 398A, a back wall portion 398B, and two side wall portions 398C and 398D. The back wall portion 398B is formed to extend a greater distance from the base 397 than the front wall portion 398A, while each side wall portion 398C and 398D is angled in its extension from the base so as to contiguously connect with both the front and back wall portions. The contiguous relationship of each wall portion to adjacent wall portions enables a top surface of each wall portion to together form the continuous shield seating surface 335, which, due to the angled nature of the wall portions as explained above, is angled with respect to base 397. The shield seating surface 335, as already discussed, is configured to engage the transceiver module seating surface 380 at the rear end 390 of the transceiver 320 (FIG. 4C) when the transceiver is fully seated within the cage 305, forming a barrier for preventing EMI emission from the interface between the transceiver 320 and the right angle connector 370. In contrast to the shield seating surface 335, the base 397 is formed so as to reside horizontally with respect to the wall portions in a parallel relationship to the host board 365. Two pegs 402 are formed on a lower face of the base 397 to facilitate mounting of the shield element 330 to the host board 365.

The EMI shield 330 includes various features that enable its inclusion within the optical transceiver module assembly 300. An aperture 399 is defined by the base 397 that enables it to receive the right angle connector 370 when the assembly is fully assembled. A groove 404 is defined on the base 397 and extends between the interface of the base with the sidewall portion 398C, the back wall portion 398B, and the other sidewall portion 398D. The groove 404 is sized to receive a portion of the cage 305 when it is connected to the host board 365, as explained below.

Though the wall portions 398A–D are contiguously formed in the embodiment illustrated in FIG. 3D, it is appreciated that one or more non-contiguous wall portion configurations can be employed in the EMI shield 330. Further, the shield seating surface 335 formed by the top surfaces of the wall portions 398A–D, though continuous in nature here can, in alternative embodiments, be non-continuous, having one or more discontinuous features thereon. Similarly, the shield seating surface can be defined by more or less than four wall portions, if desired. More generally, the EMI shield 330 is shown here having a substantially square shape when viewed from above. This particular shape should not be limiting of the present invention, however. Indeed, the particular shape of both the EMI shield 330 in general, and its constituent base, wall portions, and seating surface in particular, can vary according to need and the particular application in which the shield element will be employed. Finally, it is appreciated that the EMI shield 330 can be formed as an integral piece, or can comprise a plurality of joined components.

Figure 4A:
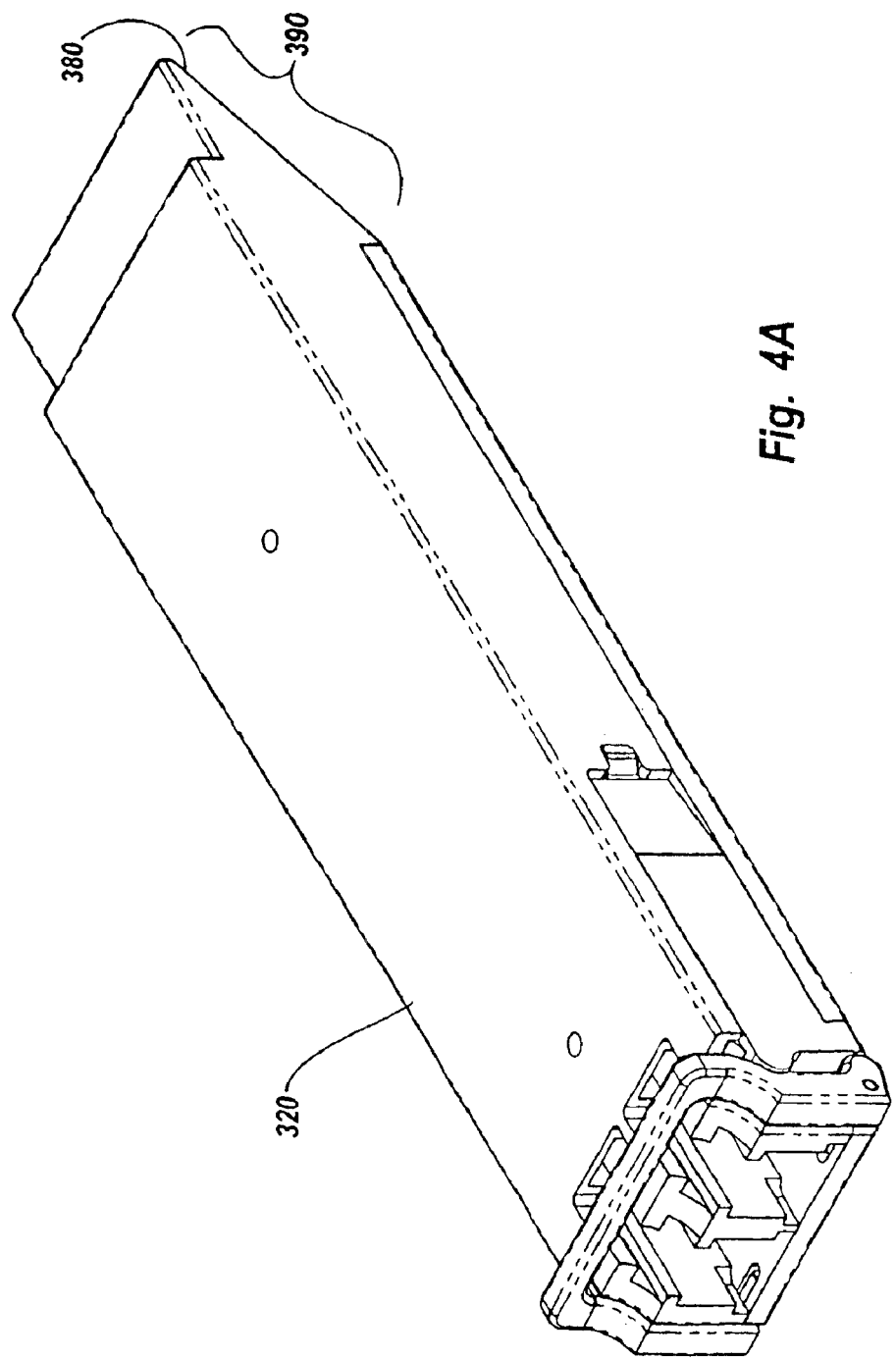
FIG. 4A is a top perspective view of a module.
Figure 4B:
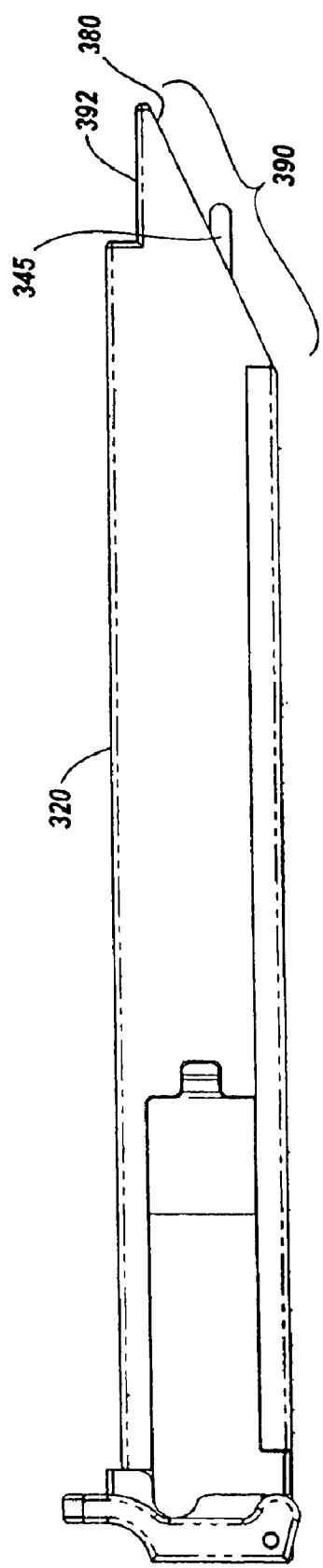
FIG. 4B is a side view of module.
Figure 4C:
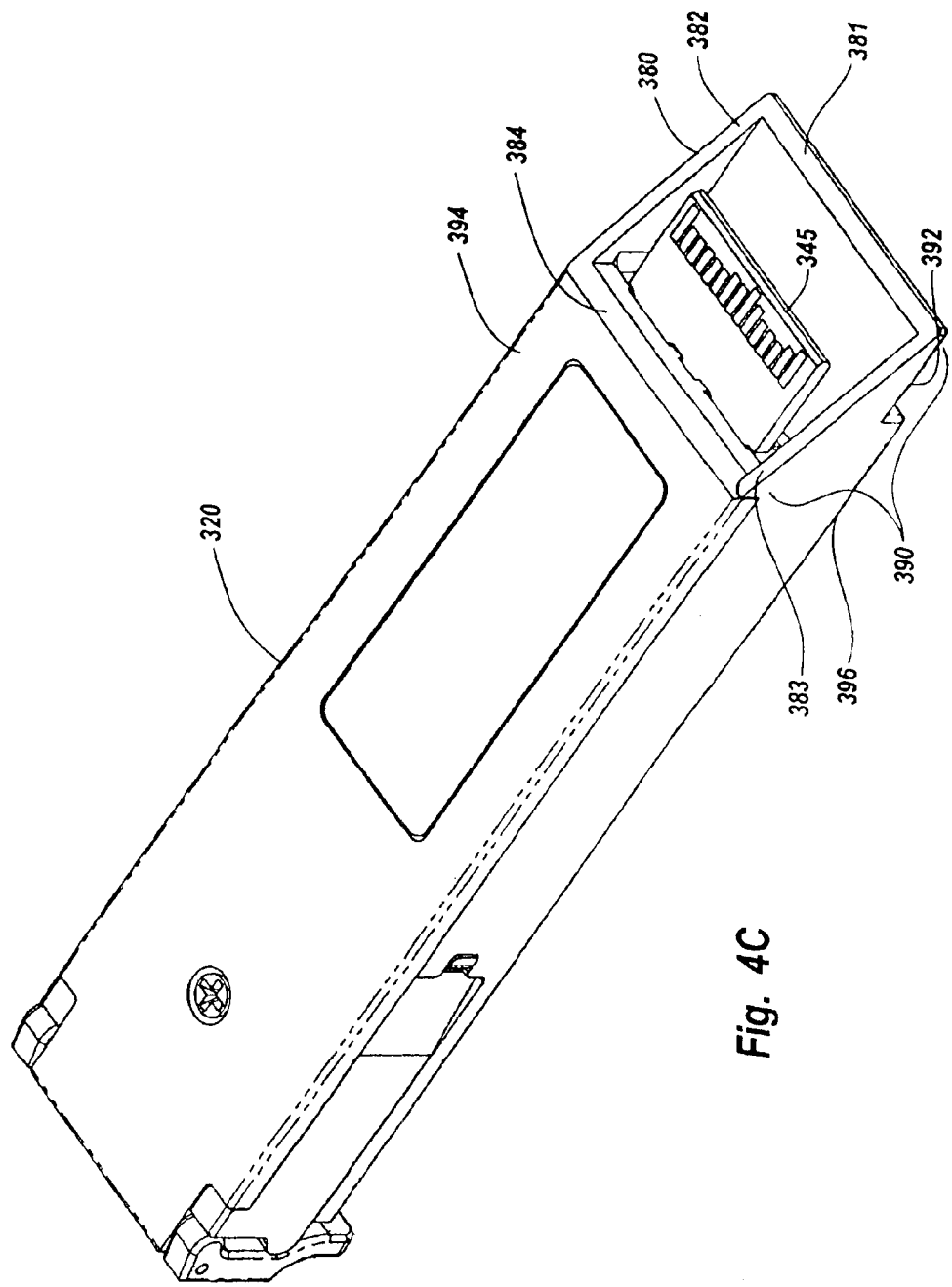
FIG. 4C is a bottom perspective view of the module.

FIG. 4A is a perspective view of one embodiment of transceiver 320 showing transceiver module seating surface 380 about rear end 390. FIG. 4B shows a side view of transceiver 320 whereas FIG. 4C shows a bottom perspective view. In this embodiment, transceiver module seating surface 380 is tilted at an angle with respect to the top and bottom surfaces of transceiver 320. Note that transceiver 320 includes shielded top, bottom, and side surfaces 392, 394, and 396 (e.g., metal surfaces). Transceiver module seating surface 380 circumscribes an open portion of the rear end 390 of transceiver 320 about card edge connector 345 and may comprise a top edge 381, two side edges 382 and 383, and a bottom edge 384.

Figure 5A:
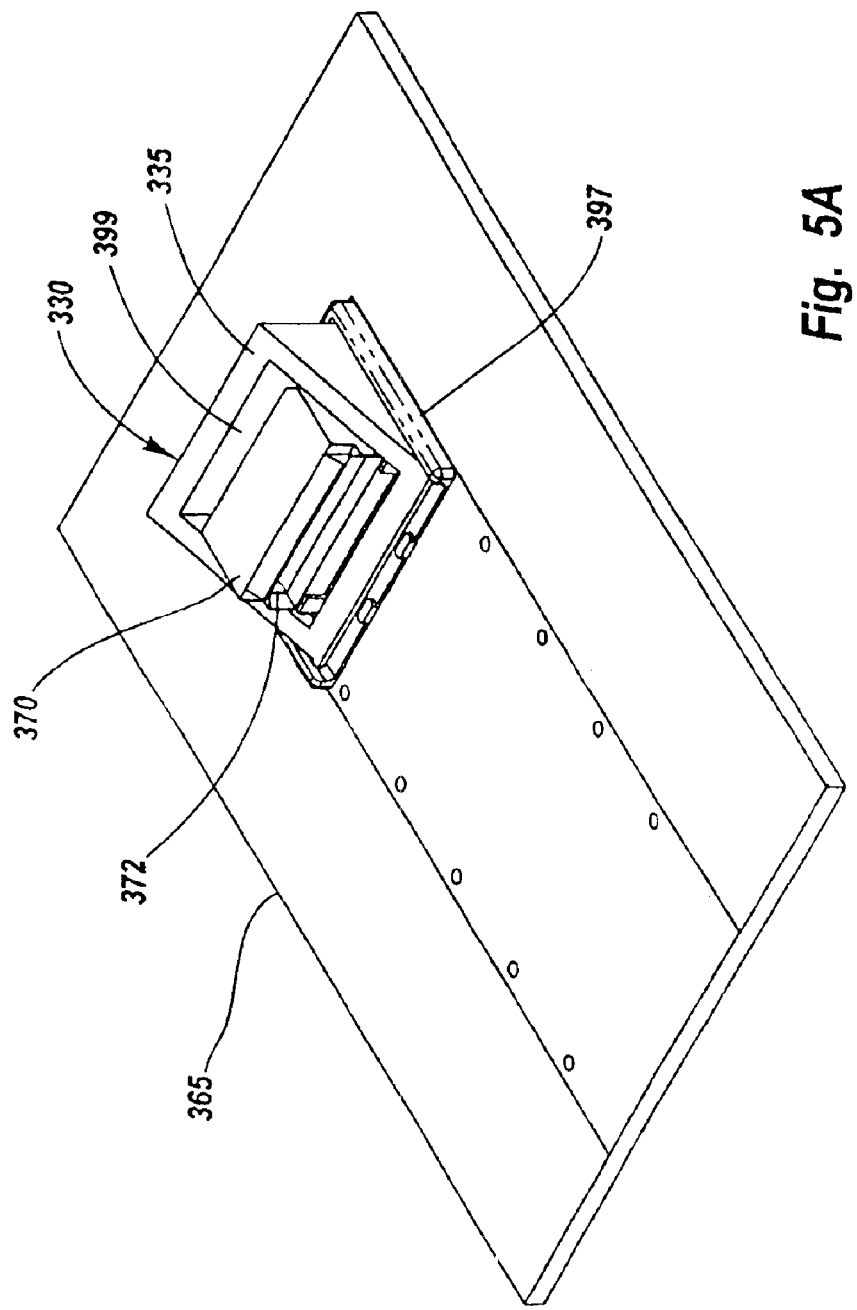
FIG. 5A is a perspective view of a host board, connector, and EMI shield element according to one embodiment.

FIG. 5A is a perspective view showing the right angle connector 370 and EMI shield 330 with cage 305 removed for the purposes of illustration. It can be seen in this embodiment that shield seating surface 335 is tilted with respect to the plane of host board 365. The base 397 of EMI shield 330 is seated on host board 365 to provide an EMI seal at the host board/shield element interface.

Figure 5B:
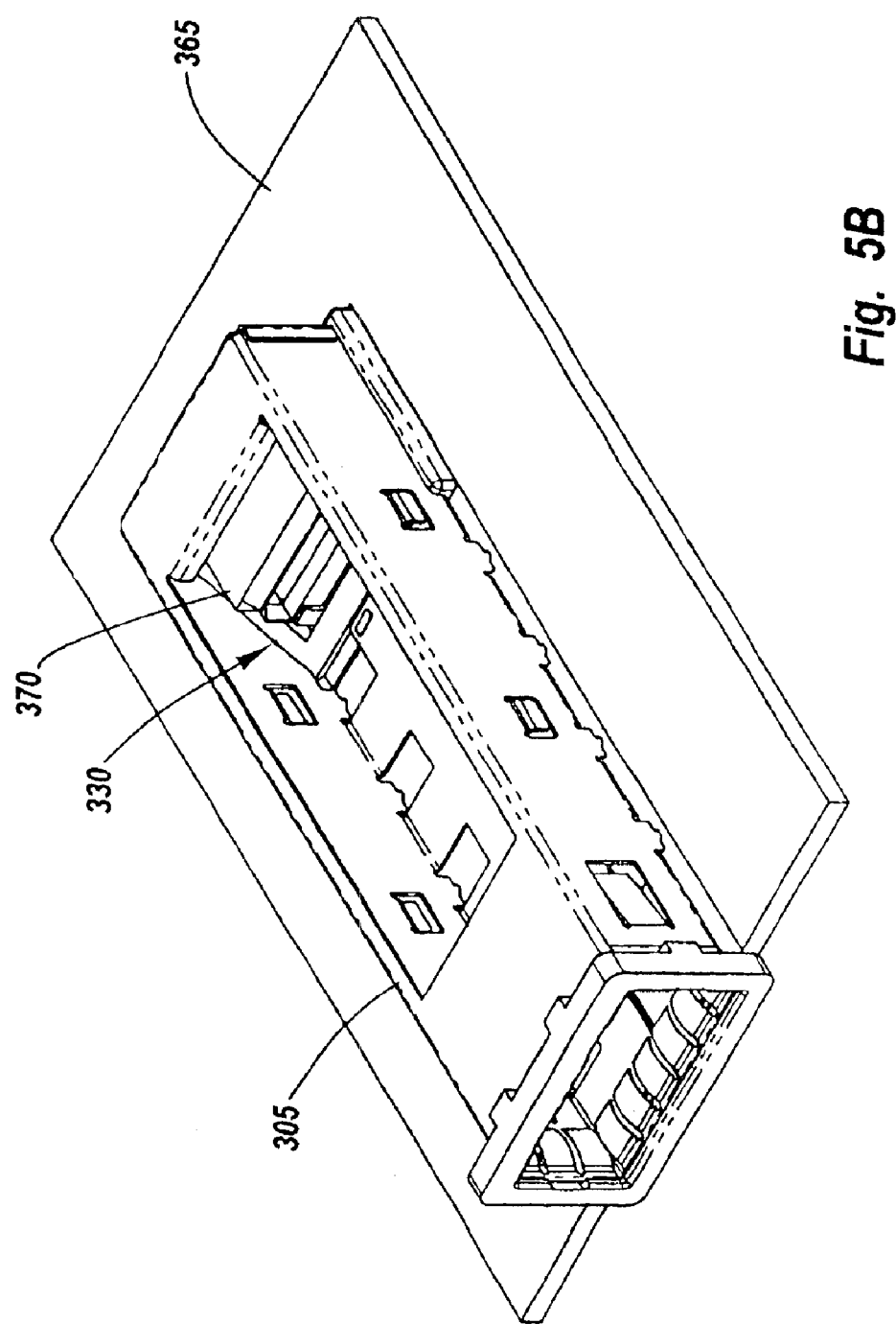
FIG. 5B is a perspective view of a host board, connector, and EMI shield with the cage inserted into place.

FIG. 5B is a corresponding perspective view with cage 305 inserted but heat sink 310 removed for the purposes of illustration. As shown, the EMI shield 330 is positioned about the right angle connector 370 such that the shield is received, along with the right angle connector, into the open portion 315 of the bottom of cage 305 when the cage is attached to the host board 365. Portions of the cage 305 adjacent the open portion 315 thereof are received into the groove 404 defined in the base 397 of the EMI shield 330 to assist in securing the shield element with respect to the cage. The cage 305, in the configuration shown in FIG. 5B, is ready to have the heat sink 310 positioned thereon and the transceiver 320 inserted therein such that the edge connector 345 of the transceiver electrically connects with the receptacle 372 of the right angle connector 370.

Figure 6A:
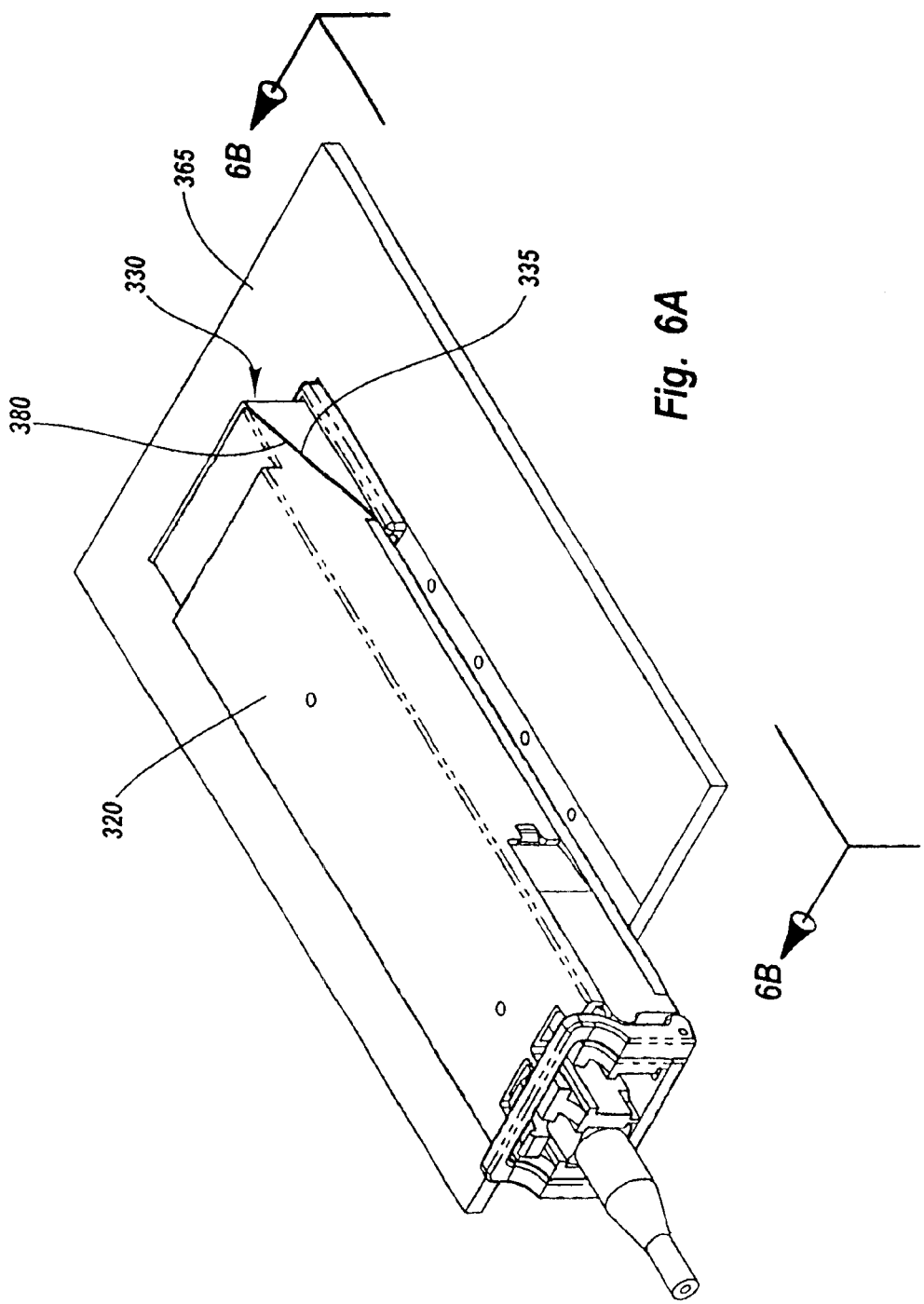
FIG. 6A is a perspective view of a module mated to an EMI shield with the cage removed for the purposes of illustration.
Figure 6B:
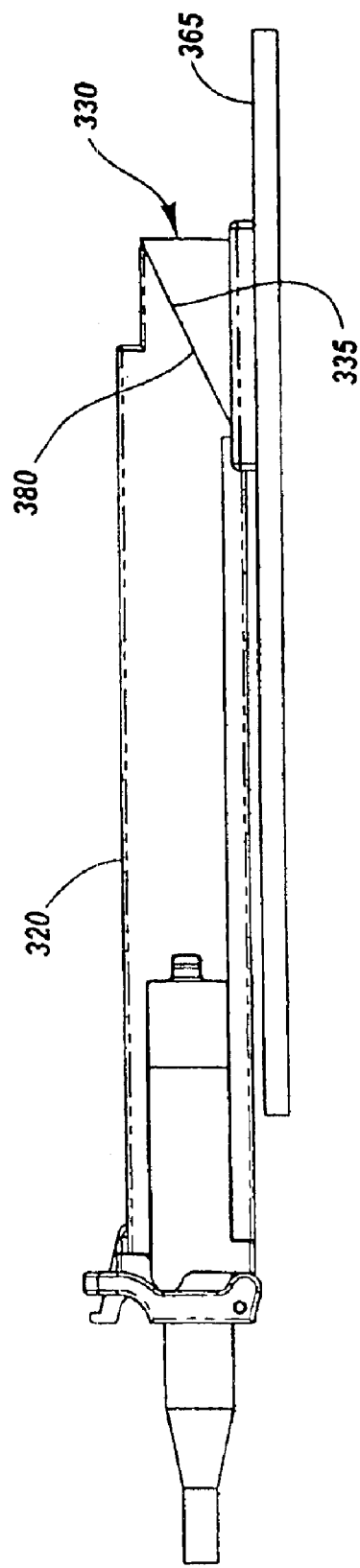
FIG. 6B is a side view of the module of FIG. 6A.

FIG. 6A is a perspective view of transceiver 320 having transceiver module seating surface 380 mated to shield seating surface 335 to form a seal about the rear end of the transceiver and the right angle connector 370. For the purposes of illustration the cage 305 is removed. FIG. 6B is a corresponding side view. In a preferred embodiment, EMI shield 330 forms an EMI seal about the rear end of the transceiver 320 and the right angle connector 370. Moreover, in one embodiment a conductive plane of host board 365 is electrically coupled to EMI shield 330 to form a bottom shield proximate open bottom end 315 of cage 305. Additional conductive vias (not shown) may be formed in host board 365 to form a lateral EMI shield within the host board proximate the perimeter of base 397. Consequently, it will be understood that in some embodiments the complete "six-sided" EMI shield is formed about the rear of the transceiver comprising the metal surfaces of the transceiver, the EMI shield, a portion of a conductive plane of the host board, and, in some embodiments, additional spaced apart conductive vias formed in the host board.

Figure 7:
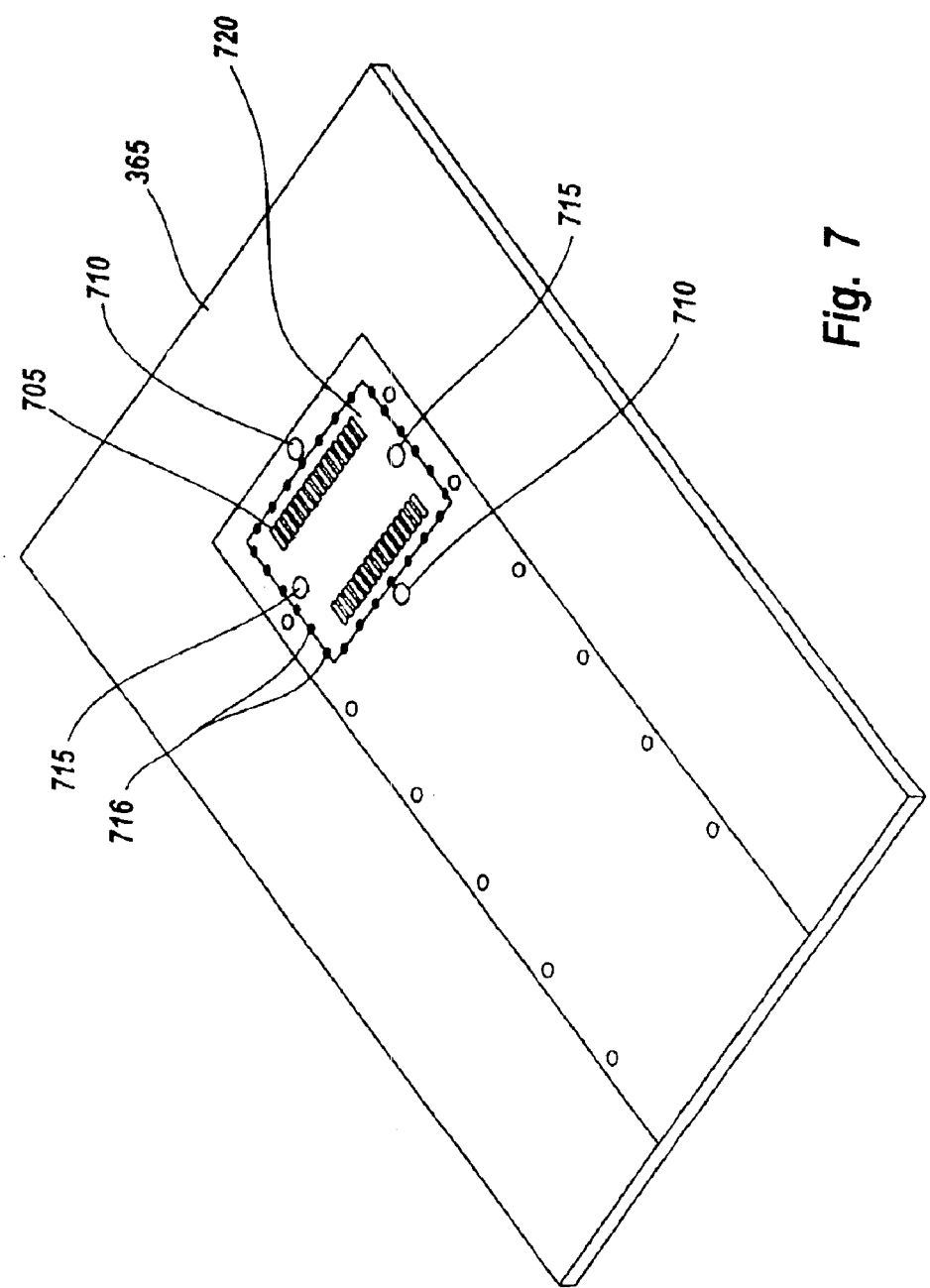
FIG. 7 is a perspective view of a host board configuration.

FIG. 7 shows one embodiment of a host board 365. Surface mount pads 705 in conjunction with electrically conductive vias (not shown) facilitate forming an electrical interface between connector 370 (FIG. 5B) and interconnects to a host. Holes 710 and 715 are shaped to hold the pegs 402 (FIG. 3D) of the EMI shield 330 (FIGS. 6A, 6B) and similar pegs defined on the connector 370, respectively. Additional conductive vias, such as vias 716 shown in FIG. 7, can be formed in the host board 365 and extend to an internal host board ground plane (not shown). The vias 716, which are formed about and proximate to the perimeter of connector region 720, connect the internal ground plane of the host board 365 to the EMI shield 330 through at least a partial thickness of the host board in order to form a complete EMI containment configuration for the edge connector/right angle connector interface region. It is nonetheless appreciated that other embodiments of the present invention can be practiced without the vias 716.

Figure 8:
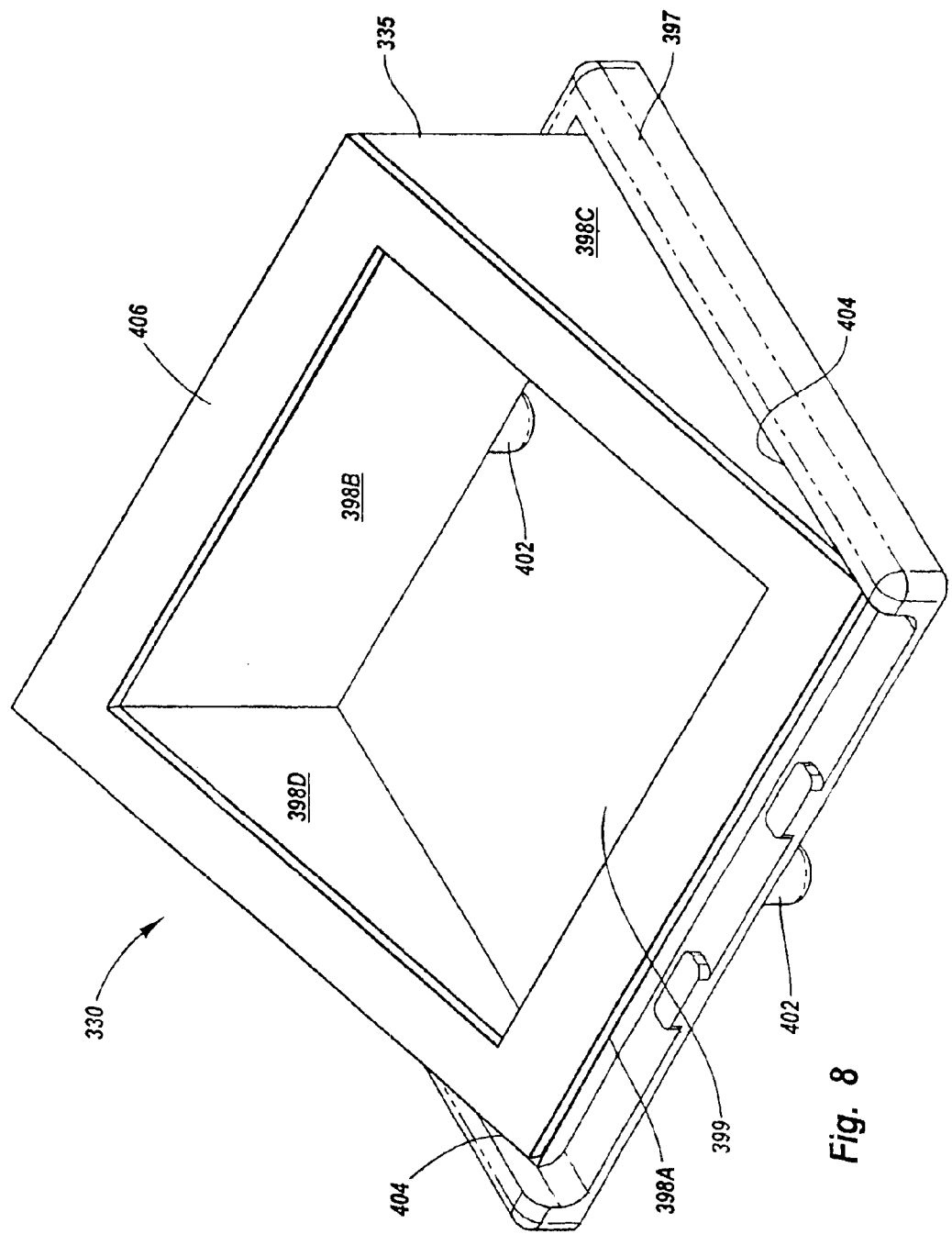
FIG. 8 is a perspective view of one embodiment of an EMI shield having an elastomer gasket positioned thereon.

A conductive elastomer gasket region is preferably disposed in or between transceiver module seating surface 380 and shield seating surface 335. The shape and elasticity of the conductive elastomer gasket region may then be selected so that the gasket region is compressed when the transceiver is fully inserted to form a tight EMI seal between the two seating surfaces, e.g., to reduce unshielded gap regions to a sufficiently small dimension to achieve a desired EMI attenuation. This may be accomplished in several different ways. In one embodiment, EMI shield 330 is comprised of a conductive elastomer, including a region about seating surface 335 such that the conductive elastomer gasket region is an integral part of shield element 330. This design, which is shown in FIG. 3D, has the benefit that no additional EMI gasket is required. Alternatively, a conductive elastomer gasket may be mounted to transceiver module seating surface 380 or to shield seating surface 335. An example is shown in FIG. 8, wherein an elastomer gasket 406 is positioned atop the shield seating surface 335 of the EMI shield 330. As shown in FIG. 8, the conductive gasket 406 may comprise a smooth surface. Alternatively, the gasket 406 may be textured to form a seal when the gasket is compressed. It will be understood that the insertion stops and locking mechanism for the transceiver 320 are configured to generate a sufficient pressure to compress the gasket region sufficiently to form an EMI seal when the transceiver is fully inserted into the cage 305.

As previously discussed, in some embodiments transceiver module seating surface 380 and shield seating surface 335 comprise angled surfaces with respect to the plane of the host board 365. In these embodiments, the rear edge surfaces of the transceiver are tilted at a fixed angle with respect to the host board 365, while the seating surface 335 of the EMI shield 330 is slanted at a complementary angle. This configuration has the benefit that it is easily manufacturable and tends to have a substantially uniform pressure across the seating surfaces to uniformly compress an elastomer gasket portion. However, more generally the transceiver module seating surface 380 and the shield seating surface 335 need only be shaped to mate with each other around the right angle connector 370. It will thus be understood that the transceiver 320 and the shield surface may comprise other profiles than those illustrated, such as complementary curved profiles or complementary stepped profiles.

One application of the shielded signal interface apparatus 300 of the present invention is for XFP transceiver modules operating at date rates of about 10 Gb/s. In an XFP embodiment, it will be understood that right angle connector 370 and associated host interconnects would be compliant with the XFI host interface standard. At data rates of 10 Gb/s there is significant EMI generated at high frequencies at correspondingly small wavelengths such that even small gaps in shielding about the connector and rear end of the transceiver is a serious concern. However, an XFP transceiver configured in accordance with the optical transceiver module assembly 300 of the present invention provides substantially complete shielding about the rear end of the transceiver and the connector, thereby reducing EMI emissions.

One benefit of the present invention is that it provides improved EMI shielding. Referring to FIG. 6A, with the transceiver inserted into place the rear end of the transceiver is completely shielded down to the host board. Moreover, in some embodiments conductive vias in the host board may be formed to provide side EMI shielding around connector feedthroughs. In one embodiment, the conductive vias are also coupled to a ground plane of the host port, providing a bottom EMI shield plane. The EMI shield may be coupled to the ground plane of the host board. Consequently, substantially the entire region between the signal feedthroughs through to the rear end of the transceiver can be shielded. Moreover, the rear end of the transceiver is substantially shielded from leaking EMI.

Another benefit of the present invention is that it improves the shielding of EMI in regards to EMI exiting from the transceiver. Conventionally, unshielded EMI generated at a card edge connector may reflect around the rear of the transceiver and exit from seams or gaps in the cage. In the present invention, the region around a card edge connector may be substantially shielded.

Yet another benefit of the present invention is that it is consistent with a low-cost manufacturing process. The EMI shield may, for example, be implemented as a single piece conductive elastomer formed using a molding process. Moreover the cost to shape the rear end of a transceiver to form a seating surface is comparatively low.

Still yet another benefit of the EMI shielding of the present invention is that it may be adapted for use in a variety of transmitter, receiver, transceiver, and transponder applications. There is a general interest in pluggable modules for high data rate telecommunications applications. At high data rates EMI can leak from even small gaps between the transceiver and the cage. Consequently, while the EMI shield of the present invention may be used to shield 10 Gb/s XFP transceiver modules it may also be adapted for use in a variety of other plug-in modules as well.

Attention is now generally directed to FIGS. 9A–14, which describe various features of another embodiment of the present invention. Various aspects of this embodiment are similar to those of the previous embodiment; as such only selected aspects of the present embodiment will be discussed in detail below.

Reference is first made to FIGS. 9A and 9B, which show top and cross sectional views, respectively, of one embodiment of an optical transceiver module assembly ("transceiver assembly"), generally designated at 800. As with the previous embodiment, the transceiver assembly 800 includes the host board 365 having the cage 305 attached thereto, the pluggable optical transceiver module ("transceiver") 320 received into the cage, and the heat sink 310 and clip 302 positioned atop the cage. The transceiver 320, when fully received into the cage 305, is positioned such that the edge connector 345 at the rear end 390 of the transceiver is received into and electrically connected with the receptacle 372 of the right angle connector 370. As before, the right angle connector 370 is connected with the host board 365 and extends through the open portion 315 defined in the cage 305.

The rear end 390 of the transceiver 320 includes the top surface 392 and transceiver module seating surface 380. As previously described, these structures provide EMI shielding for a portion of the transceiver 320 itself. The transceiver module seating surface 380 is angled with respect to the plane of the host board 365.

In accordance with the present embodiment, FIGS. 9A and 9B further depict another means for shielding EMI about the electrical connection of the edge connector with the right angle connector receptacle. In particular, the present embodiment discloses this means as an EMI shield 830 having a shield seating surface 835, wherein the shield serves to reduce the emission of EMI as described. As before, this desirably results in improved EMI containment with respect to the host device and surrounding environment. The EMI shield 830 of the present embodiment includes features that facilitate mating between the transceiver 320 and the EMI shield, as will be discussed.

Figure 10:
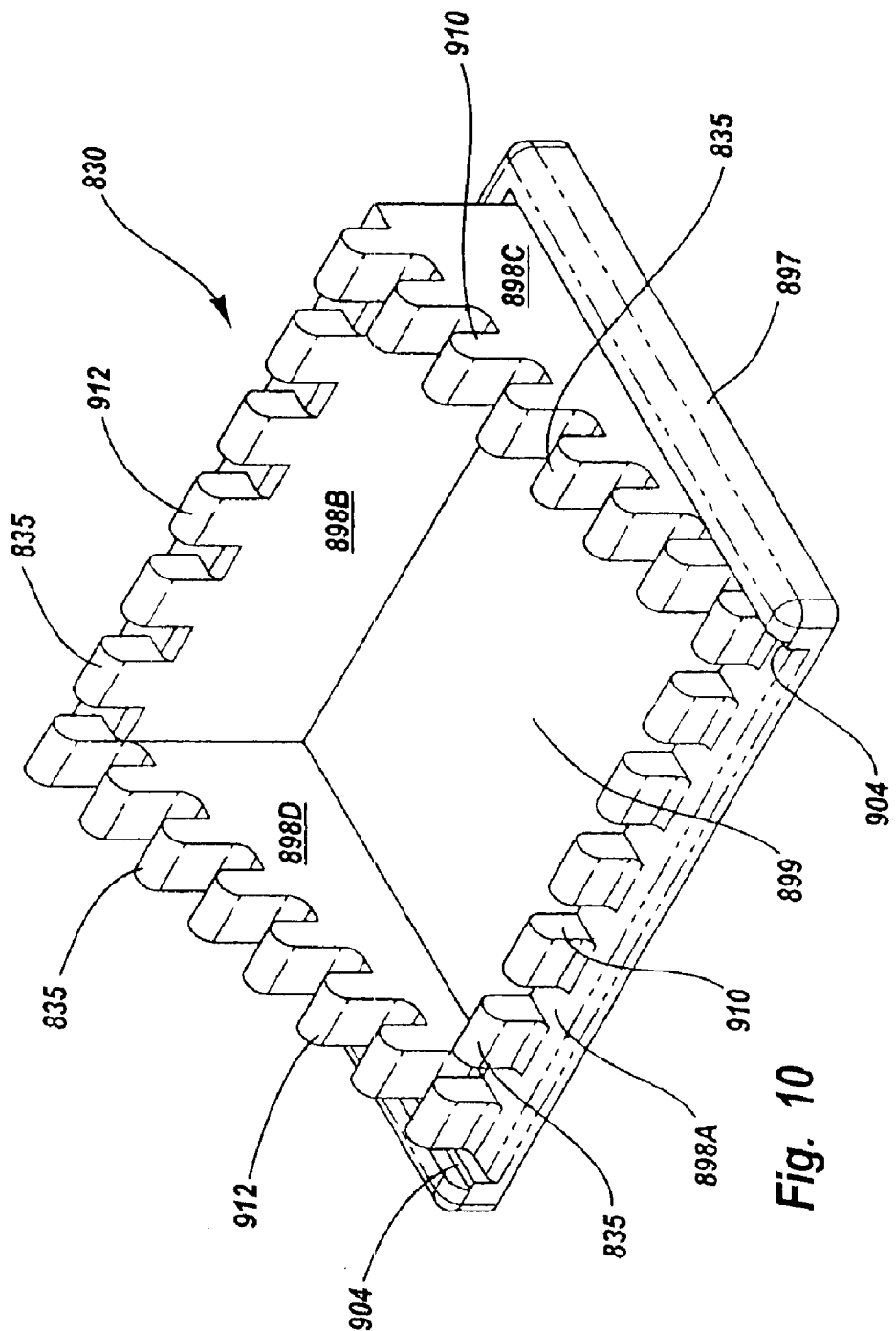
FIG. 10 is a perspective view an EMI shield employed in connection with the transceiver module system illustrated in FIG. 8.

Reference is now made to FIG. 10, which depicts various aspects of the EMI shield 830, according to the present embodiment. The general structure of the EMI shield 830 is similar to that of the EMI shield 330 of the previous embodiment. In particular, the EMI shield 830 includes a base 897 from which extend a front wall portion 898A, a back wall portion 898B, and two sidewall portions 898C and 898D that interconnect with the front and back wall portions. The base 897 and wall portions 898A–D define an aperture 899 for use in positioning the EMI shield 830 within the transceiver assembly 800, as will be seen. Also shown is a groove 904 defined between the base and the back and both side wall portions 898B, 898C, and 898D to enable coupling of the cage 305 with the EMI shield 830. It is noted here that the wall portions 898 A–D, while shown here in one preferred configuration, can comprise a variety of shapes, sizes, and slanted configurations. Indeed, in one embodiment, at least the sidewall portions 898C and 898D can be horizontally oriented on the base 897 with respect to the host board 365.

FIG. 10 further depicts additional features of the EMI shield 830, including a plurality of extended surfaces 910 that are operably connected to the base 897. In particular, a plurality of extended surfaces 910 extends from each of the wall portions 898A–D. As shown, the extended surfaces 910 are positioned in a uniformly spaced-apart configuration on the wall portions 898A–D in a tooth-like or peak-and-valley configuration. In the present embodiment, the front wall portion 898A, upon which extended surfaces 910 are located, is essentially co-planar with a portion of the base 897, though it may comprise a greater height in other embodiments.

A top surface 912 of each extended surface 910 in this embodiment is rounded to comprise, together with the other top surfaces, the shield seating surface 835 that enables the EMI shield 830 to engage with the rear end 390 of the transceiver 320, as seen below.

As with the previous embodiment, at least a portion of the EMI shield 830 is preferably composed of a conductive elastomer material. In one embodiment, the entire EMI shield 830 can be composed of such a material. In another embodiment, only the extended surfaces 910 are made from conductive elastomer. In yet other embodiments, varying portions of the EMI shield 830 are made from conductive elastomer, or a complementarily fitting gasket (not shown) made from a conductive elastomer is interposed between the EMI shield 830 and the transceiver 320. These and other combinations are therefore contemplated with respect to the present invention.

The EMI shield 830 depicted in FIG. 10 shows but one possible arrangement and configuration of the extended surfaces 910. The extended surfaces 910 shown in FIG. 10 are spaced sufficiently close to one another as to prevent the passage of high frequency signals (in this instance, signals associated with data rates at 10 Gb/s) through the spaces between the extended surfaces, thereby preventing EMI emission. Notwithstanding, the spacing between the extended surfaces 910 can be modified in other embodiments to meet the shielding needs of specified implementations. In yet other embodiments, not only the spacing, but also the height, shape, and spacing uniformity of the extended surfaces can be varied according to the needs of a particular application. One skilled in the art will further appreciate that, though shown as substantially uniform here, some of the extended surfaces can vary in size, shape, and/or relative spacing with respect to other extended surfaces that are located on the same shield element. These and other modifications to the present invention are therefore contemplated.

More generally, it is recognized that the wall portions of the present shield element can be adapted for use with transceiver assemblies, transceivers, and other optoelectronic modules having varying designs and configurations. For instance, the wall portions of the EMI shield can be adapted in relative height and angle in order to accommodate the mating with a transceiver having a rear end that differs in shape or size from that depicted herein.

Figure 11:
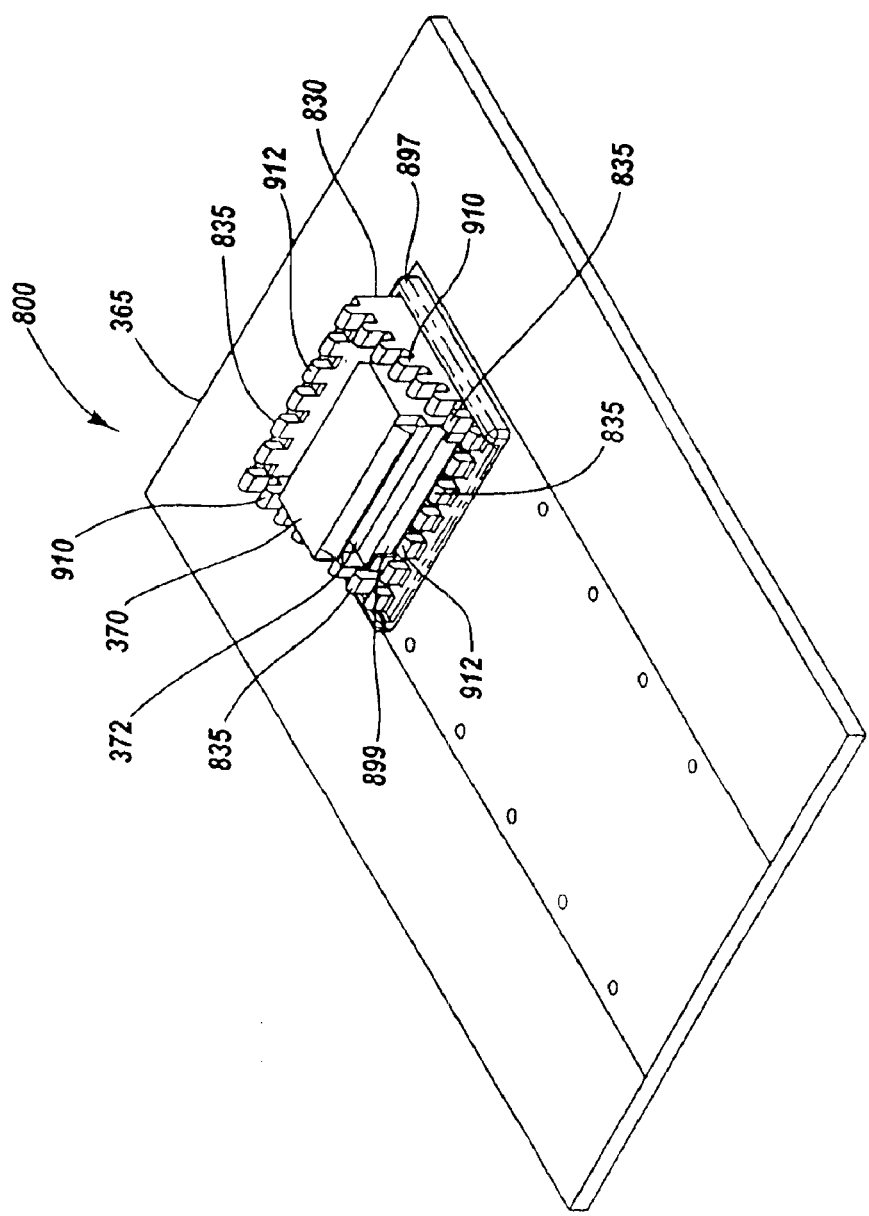
FIG. 11 is a perspective view of a host board, connector, and EMI shield of the transceiver module system of FIG. 8.

Reference is now made to FIG. 11, which shows the location of the EMI shield 830 within the transceiver assembly 800. As depicted, the EMI shield 830 is placed on the host board 365 such that its base 897 is mounted parallel to the board and its aperture 899 receives a portion of the right angle connector 370, which is also attached to the host board. In this position, the EMI shield 830 is ready to have the cage 305 placed about it and the transceiver 320 seated therewith, as shown in the following figures, in order to provide EMI shielding for the transceiver assembly 800.

Figure 12:
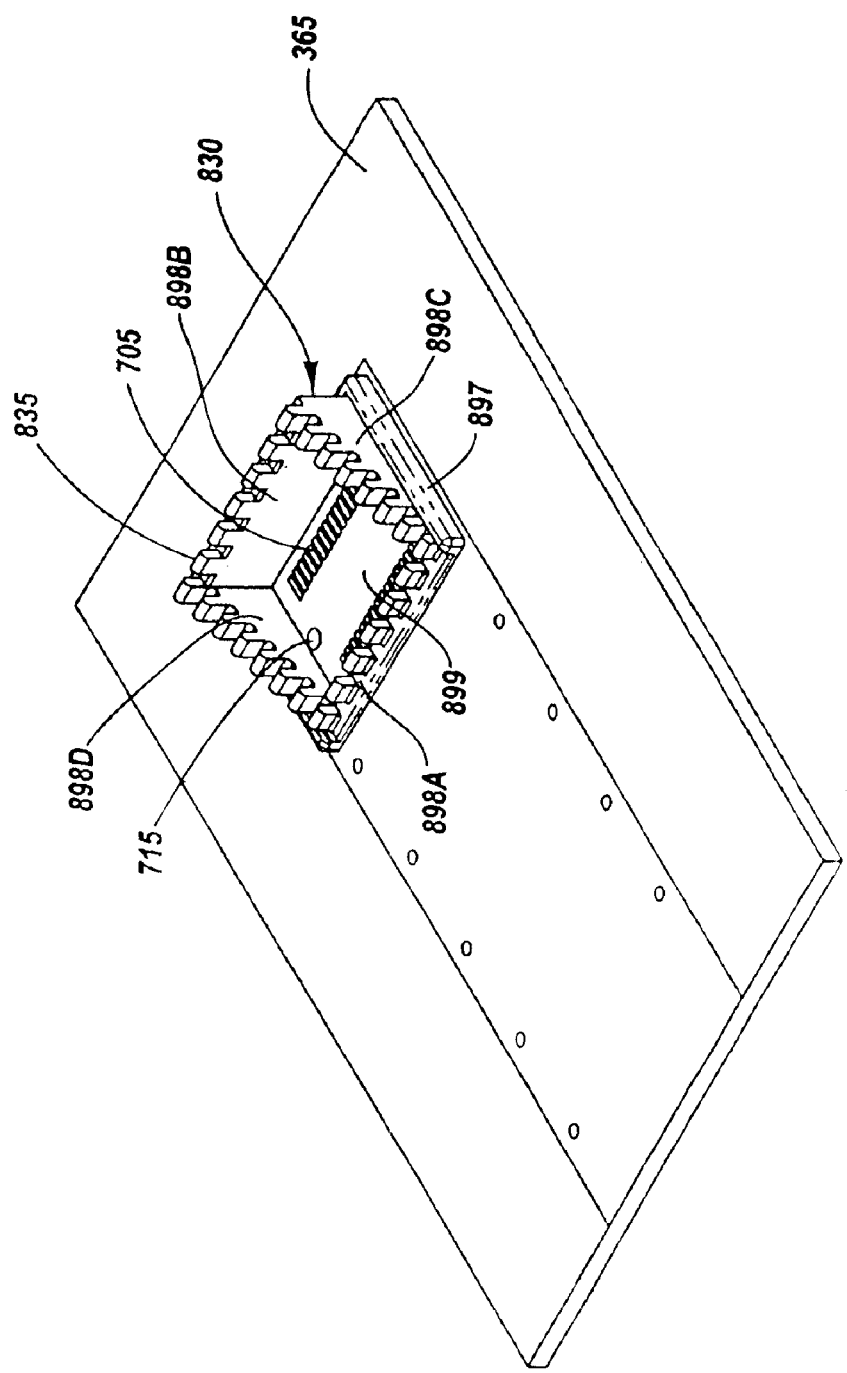
FIG. 12 is a perspective view of the host board and EMI shield element of FIG. 11.
Figure 13:
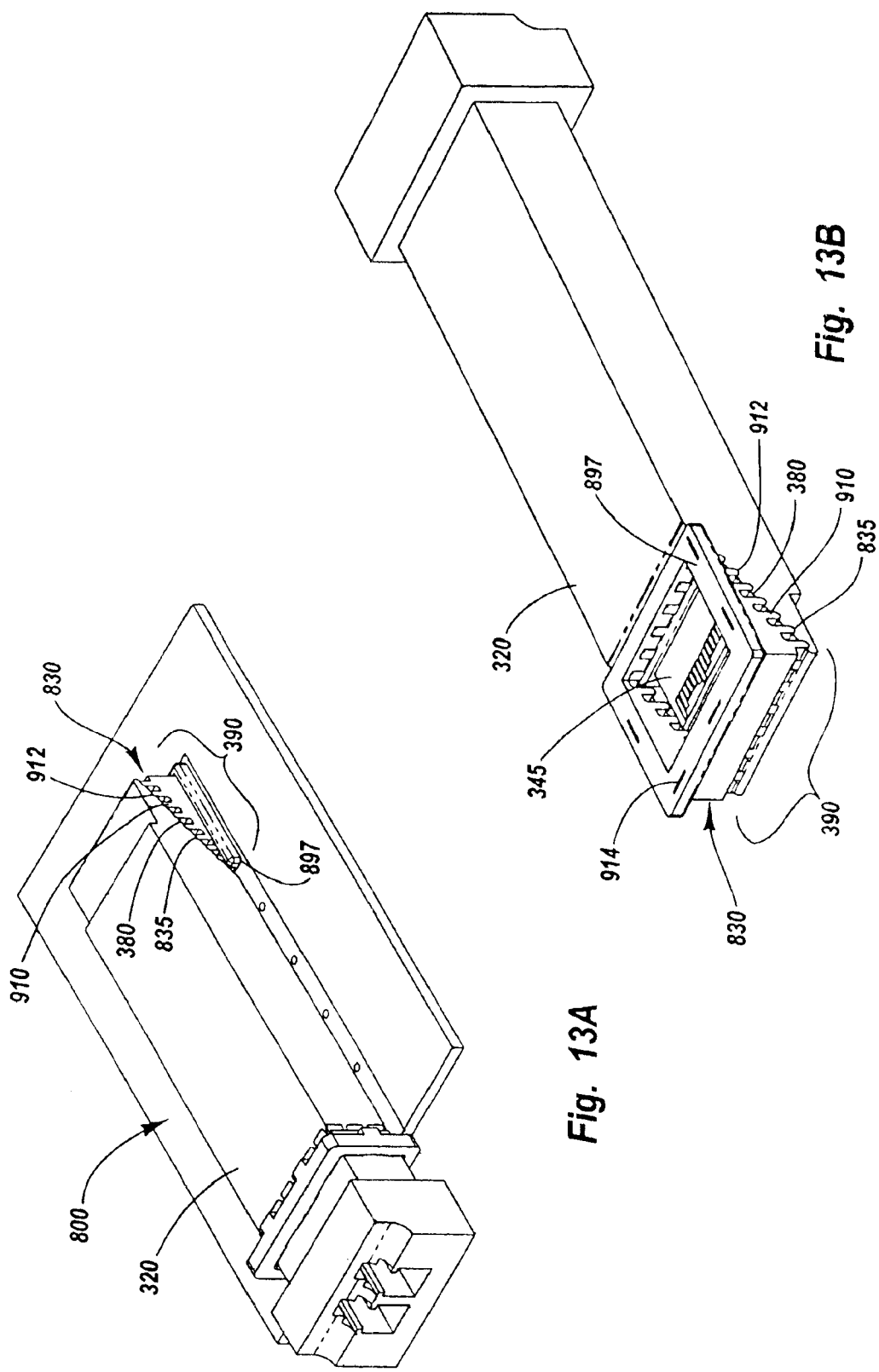
FIG. 13A is a perspective view of the transceiver module system of FIG. 8 with the cage removed.
FIG. 13B is a perspective view of the transceiver module system of FIG. 8 with the cage and host board removed.

Reference is now made to FIG. 12, which shows the EMI shield 830 positioned on the host board 365 as in FIG. 11, but with the right angle connector 370 removed. Among other aspects, this figure shows the plurality of surface mount pads 705 for use in electrically connecting the right angle connector 370 with a host (not shown) via the host board 365. Also shown is one of the holes 715 for receiving a correspondingly sized peg of the right angle connector 370. As shown, the EMI shield 830 is sized such that its wall portions 898A–D form a perimeter of the aperture 899 within which the right angle connector 370 is received.

Reference is now made to FIGS. 13A and 13B, which collectively show various details regarding the engagement between the transceiver 320 and the EMI shield 830 within the transceiver assembly 800 (note that the cage 305 has been removed in each of these figures, as well as the right angle connector from FIG. 13B, for purposes of illustration). Specifically, these figures show engagement between the angled transceiver module seating surface 380 of the transceiver 320 and the complementarily-angled shield seating surface 835 defined by each of the extended surfaces 910 of the EMI shield 830. When fully received into the cage 305 (not here shown), the edge connector 345 extending from the rear end 390 of the transceiver 320 is received into the receptacle 372 defined by the right angle connector (FIG. 9B), as has been described. This proximity also brings the rear end 390 of the transceiver 320 into contact with the EMI shield 830 such that the transceiver module seating surface 380 defined on the rear end physically engages the top surfaces 912 of each of the extended surfaces 910 that define the shield seating surface 835 of the EMI shield 830. This engagement between the transceiver module seating surface 380 and the shield seating surface 835 provides, as in the previous embodiment, an EMI shield to prevent EMI emissions from the region surrounding the electrical interface between the edge connector 345 of the transceiver 320 and the receptacle 372 of the right angle connector 370 (FIG. 9B).

In presently preferred embodiments, the extended surfaces 910 are comprised of a conductive elastomer having resilient properties, as already discussed. The resilience of the elastomeric extended surfaces 910, along with the design of the extended surfaces, facilitates mating of the module seating surface 380 and the shield seating surface 835 by providing a certain amount of "play" between the seating surfaces when mating occurs. This play equates to a distance range along which full contact between the module seating surface 380 and the shield seating surface 835 is established, thereby compensating for tolerance variations or other conditions that would otherwise prevent full engagement of the mating surfaces or that would cause an excessive contact force to be imposed between the mating surfaces. Of course, other mating surface arrangements can be used to accomplish the same functionality as disclosed herein.

FIG. 13B further depicts various slots 914 defined through the bottom of the base 897 of the EMI shield 830. The slots 914 are present to enable prongs (FIG. 14) of the cage 305 to extend through the base 897 of the EMI shield 830 when the transceiver assembly 800 is fully assembled.

Figure 14:
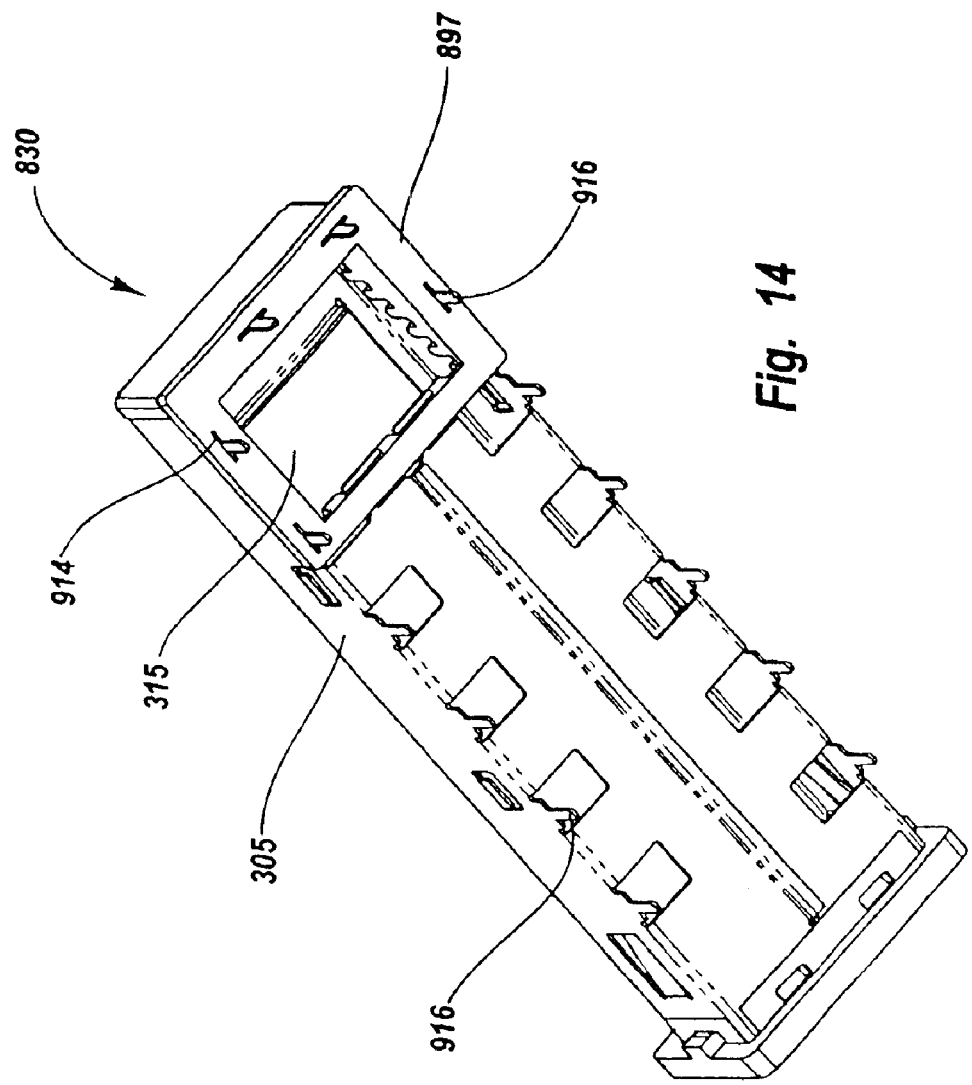
FIG. 14 is a bottom perspective view of the cage of FIG. 8 having the EMI shield connected thereto.

Reference is now made to FIG. 14, which shows various details regarding the engagement between the cage 305 of the transceiver assembly 800 and the EMI shield 830 (other components of the transceiver assembly have been removed for purposes of illustration). The bottom of the cage 305 is shown in FIG. 14, affording a view of the open portion 315 thereof, and the EMI shield 830. The open portion 315 of the cage 305 is sized to receive therein the wall portions 898A–D (FIG. 12) of the EMI shield 830, while a portion of the cage adjacent the open portion is received into the groove 904 (FIG. 10) of the EMI shield base 897. The cage 305 includes prongs 916 that enable the cage to electrically connect with the host board 365 (FIG. 12). As shown, a selected few of these prongs 916 pass through the slots 914 defined through the base 897 of the EMI shield 830.

While the present invention has been illustrated in regards to an opto-electronic module having an edge connector and a corresponding female receptacle, it will be understood that the present invention may be applied more generally to a variety of module connector designs.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A signal interface, comprising:
a host board;
a right angle connector mounted to the host board, the right angle connector including a receptacle;
an optical transceiver module having an edge connector that electrically connects with the receptacle; and
means, interposed between the optical transceiver module and the host board, for shielding electromagnetic interference ("EMI") EMI about the electrical connection of the edge connector with the receptacle, the means including an EMI shield having a base and a plurality of walls extending from the base, the walls defining a seating surface that engages a rear end of the optical transceiver module when the edge connector is received into the receptacle of the right angle connector, wherein the seating surface of the shield element and the rear end of the optical transceiver module are complementarily angled to physically engage one another.

2. A signal interface as defined in claim 1, wherein the means for shielding attaches to the host board.

3. A signal interface as defined in claim 1, wherein the walls include a plurality of extended surfaces that each engage the rear end of the optical transceiver module when the edge connector is received into the receptacle of the right angle connector.

4. A signal interface as defined in claim 1, wherein the optical transceiver module conforms to the XFP standard.

5. A transceiver apparatus, comprising:
a host board;
a right angle connector mounted to the host board having a receptacle, the right angle connector electrically coupled to feedthroughs disposed in the host board;
a transceiver module having an edge connector extending from a rear end of the transceiver module, the edge connector inserted into the receptacle;
an electromagnetic interference ("EMI") shield element having a shield seating surface mated with a transceiver module seating surface disposed on the rear end of the transceiver module;
the EMI shield element shaped to shield the rear end of the transceiver module and the right angle connector; and
an elastomer gasket that is interposed between the shield seating surface and the transceiver module seating surface.

6. A transceiver apparatus as defined in claim 5, wherein the EMI shield element is comprised of a conductive elastomer.

7. A transceiver apparatus as defined in claim 5, wherein a conductive ground plane located in the host board is electrically connected to a portion of the EMI shield by a plurality of conductive vias.

8. A transceiver apparatus as defined in claim 5, wherein the EMI shield element includes two sidewalls and an end wall forming a hood about the right angle connector.

9. A transceiver apparatus, comprising:
a host board:
a right angle connector mounted to the host board having a receptacle, the right angle connector electrically coupled to feedthroughs disposed in the host board;
a transceiver module having an edge connector extending from a rear end of the transceiver module, the edge connector inserted into the receptacle;
an electromagnetic interference ("EMI") shield element having a shield seating surface mated with a transceiver module seating surface disposed on the rear end of the transceiver module, wherein the shield seating surface is tilted at an angle with respect to the host board and the transceiver module seating surface is tilted at a complementary angle; and
the EMI shield element shaped to shield the rear end of the transceiver module and the right angle connector.

10. In an optical transceiver module assembly that includes an optical transceiver module and a host board, a shield for use in reducing electromagnetic interference ("EMI"), comprising:
a base defining an aperture, the aperture being sized to receive a connector that is electrically connected to the host board;
a plurality of wall portions extending from the base, wherein the wall portions include a front wall portion, a back wall portion, and two sidewall portions, each sidewall portion being connected to both the front and back wall portions, the back wall portion having a height greater than that of the front wall portion, and each sidewall portion being angled; and
a plurality of extended portions operably connected to the base and located on the wall portions, the extended portions being configured to reduce EMI from the optical transceiver module assembly when the optical transceiver module engages the connector.

11. An optical transceiver module assembly, comprising:

a connector;

an optical transceiver module having an edge connector that extends from a rear end of the optical transceiver module, the edge connector being received by a receptacle defined in the connector; and an electromagnetic interference ("EMI") shield positioned at least partially about the connector, the shield having a horizontal base and a plurality of extended surfaces positioned in a spaced-apart arrangement on the base, the extended portions being positioned on wall portions, the wall portions extending from the base, the extended surfaces positioned to reduce EMI from the rear end of the optical transceiver module, wherein the rear end of the optical transceiver module is angled with respect to the horizontal base, and wherein the wall portions are shaped such that the extended surfaces engage the rear end of the optical transceiver module when the edge connector is received by the connector.

12. An optical transceiver module as defined in claim 11, wherein the extended surfaces are arranged in a tooth-like configuration on the base.

13. An optical transceiver module as defined in claim 11, wherein the base defines an aperture that receives at least a portion of the connector.

14. An optical transceiver module assembly, comprising:

a host board;

a host board connector attached to the host board, the host board connector having a receptacle oriented substantially at a right angle with respect to the host board;

a cage mounted on the host board such that the host board connector extends into the cage through an open portion defined in the cage;

an optical transceiver module having an edge connector extending through a rear portion of the optical transceiver module, the rear portion being slanted with respect to the host board, the edge connector being received into the receptacle of the host board connector; and an electromagnetic interference ("EMP") shield, comprising:

a base defining an aperture that receives a portion of the host board connector, the base operably connected to the host board such that is extends through the open portion defined in the cage;

a back wall portion extending from the base;

two sidewall portions extending from the base; each sidewall portion being slanted to form a continuous wall with the back wall portion; and a plurality of extended surfaces located on the back wall portion and sidewall portions, at least some of the extended surfaces engaging the slanted rear end of the optical transceiver module when the edge connector is received into the receptacle of the host board connector.

15. An optical transceiver module assembly as defined in claim 14, wherein the extended surfaces of the EMI shield are positioned in a spaced-apart arrangement on the wall portions of the base.

16. An optical transceiver module assembly as defined in claim 15, wherein the back wall portion and sidewall portions are positioned on the base such that they surround a portion of the aperture.

17. An optical transceiver module assembly as defined in claim 16, wherein the base is substantially parallel to the host board.

18. An optical transceiver module assembly as defined in claim 17, wherein at least some of the extended surfaces of the EMI shield have rounded top portions, the rounded top portions engaging with the slanted rear end of the optical transceiver module.

19. An optical transceiver module assembly as defined in claim 18, wherein at least a portion of the EMI shield is formed of an elastomeric material.

20. An optical transceiver module assembly as defined in claim 19, further comprising a groove defined in the base to enable the base to receive a portion of the cage.

21. An optical transceiver module assembly as defined in claim 20, wherein at least some of the extended portions are located on the base.

* * * * *